United States Patent
Suguro et al.

(10) Patent No.: US 8,497,205 B2
(45) Date of Patent: Jul. 30, 2013

(54) SEMICONDUCTOR DEVICE MANUFACTURING METHOD, WIRING AND SEMICONDUCTOR DEVICE

(75) Inventors: Kyoichi Suguro, Yokohama (JP); Mitsuaki Izuha, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/340,109

(22) Filed: Dec. 29, 2011

(65) Prior Publication Data

US 2012/0164811 A1 Jun. 28, 2012

Related U.S. Application Data

(63) Continuation of application No. 11/318,478, filed on Feb. 28, 2005, now abandoned.

(30) Foreign Application Priority Data

Dec. 28, 2004 (JP) ................. 2004-381419

(51) Int. Cl.
*H01L 21/22* (2006.01)
*H01L 21/8238* (2006.01)

(52) U.S. Cl.
USPC ........... 438/655; 438/530; 438/545; 438/663; 257/E21.135; 257/E21.199; 257/E21.636

(58) Field of Classification Search
USPC ............ 438/581, 582, 583, 630, 649, 651, 438/669, 721, 755, 510–569, 652–664, 682–685; 257/E21.135, E21.199, E21.636
See application file for complete search history.

(56) References Cited

U.S. PATENT DOCUMENTS

| 4,389,257 A | 6/1983 | Geipel, Jr. et al. |
| 4,803,539 A | 2/1989 | Psaras et al. |
| 4,847,213 A | 7/1989 | Pfiester |
| 5,633,523 A * | 5/1997 | Kato ............... 257/369 |
| 5,641,983 A * | 6/1997 | Kato et al. ............ 257/412 |

(Continued)

FOREIGN PATENT DOCUMENTS

| JP | 5-090574 | 4/1993 |
| JP | 07-231091 A | 8/1995 |

(Continued)

OTHER PUBLICATIONS

Notification of Opinions on Examination issued by the Taiwan Patent Office on Apr. 17, 2007, for Taiwan Patent Application No. 094145936, and English-language translation thereof.

(Continued)

*Primary Examiner* — Robert J Hoffberg
*Assistant Examiner* — Eric Ward
(74) *Attorney, Agent, or Firm* — Finnegan, Henderson, Farabow, Garrett & Dunner, L.L.P.

(57) ABSTRACT

In an embodiment of the present invention, a semiconductor layer having regions into which a p-type impurity, an n-type impurity and a (p+n) impurity are respectively introduced is formed as a surface layer by being heat-treated. An impurity segregation layer on these regions is removed, and a film of a metallic material is thereafter formed on the regions and is heat-treated, thereby forming a silicide film on the semiconductor layer. In another embodiment, an impurity is introduced into the impurity segregation layer, and a film of a metallic material is thereafter formed on the impurity segregation layer and is heat-treated to form a silicide film.

18 Claims, 4 Drawing Sheets

U.S. PATENT DOCUMENTS

| | | | |
|---|---|---|---|
| 5,700,719 A * | 12/1997 | Yuzurihara et al. | 438/621 |
| 6,030,861 A * | 2/2000 | Liu | 438/217 |
| 6,054,353 A | 4/2000 | Sheu et al. | |
| 6,127,707 A | 10/2000 | Chong et al. | |
| 6,465,295 B1 | 10/2002 | Kitamura | |
| 6,620,666 B2 * | 9/2003 | Yoshiyama et al. | 438/195 |
| 6,740,935 B2 | 5/2004 | Kitamura | |
| 6,781,207 B2 | 8/2004 | Kumeno | |
| 6,800,512 B1 | 10/2004 | Itonaga et al. | |
| 6,812,529 B2 * | 11/2004 | Trivedi et al. | 257/371 |
| 6,841,429 B2 * | 1/2005 | Matsuda et al. | 438/153 |
| 6,900,144 B2 | 5/2005 | Maeda et al. | |
| 6,962,841 B2 | 11/2005 | Trivedi et al. | |
| 7,186,632 B2 | 3/2007 | Ogawa et al. | |
| 2001/0052626 A1 * | 12/2001 | Lo | 257/412 |
| 2002/0025663 A1 | 2/2002 | Yoshiyama | |
| 2002/0042197 A1 * | 4/2002 | Cabral et al. | 438/655 |
| 2003/0013245 A1 | 1/2003 | Kitamura | |
| 2003/0109116 A1 * | 6/2003 | Lee et al. | 438/500 |
| 2004/0016973 A1 * | 1/2004 | Rotondaro et al. | 257/374 |
| 2004/0018708 A1 | 1/2004 | Ogawa et al. | |
| 2004/0061191 A1 | 4/2004 | Paton et al. | |
| 2004/0166615 A1 * | 8/2004 | Osanai | 438/197 |
| 2004/0197898 A1 | 10/2004 | Nakatani et al. | |
| 2005/0189596 A1 | 9/2005 | Takahashi | |
| 2006/0019437 A1 * | 1/2006 | Murto et al. | 438/199 |

FOREIGN PATENT DOCUMENTS

| | | |
|---|---|---|
| JP | 9-199717 | 7/1997 |
| JP | 9-205203 | 8/1997 |
| JP | 09-251967 A | 9/1997 |
| JP | 10-50862 | 2/1998 |
| JP | 2000-068506 A | 3/2000 |
| JP | 2000-315662 | 11/2000 |
| JP | 2001-291780 | 10/2001 |
| JP | 2002-076138 A | 3/2002 |
| JP | 2003-282874 | 10/2003 |
| TW | 419729 | 1/2001 |
| TW | 558754 | 10/2003 |

OTHER PUBLICATIONS

Decision of Final Rejection mailed by the Japanese Patent Office on May 11, 2010, for Japanese Patent Application No. 2004-381419, and an English-language translation thereof.

Notification of Reasons for Rejection mailed by the Japanese Patent Office on Jan. 29, 2010, for Japanese Patent Application No. 2004-381419, and an English-language translation thereof.

Notification of Reason for Rejection issued by the Japanese Patent Office on Sep. 25, 2012, for Japanese Patent Application No. 2010-163016, and English-language translation thereof.

Decision of Rejection issued by the Japanese Patent Office on Jan. 11, 2013, for Japanese Patent Application No. 2010-163016, and English-language translation thereof.

* cited by examiner

SEMICONDUCTOR DEVICE MANUFACTURING METHOD, WIRING AND SEMICONDUCTOR DEVICE

CROSS-REFERENCE TO RELATED APPLICATION

This is a continuation of application Ser. No. 11/318,478, filed Feb. 28, 2005 now abandoned, which is incorporated herein by reference.

This application is based upon and claims the benefit of priority from prior Japanese Patent Application No. 2004-381419, filed on Dec. 28, 2004, the entire contents of which are incorporated herein by reference.

BACKGROUND OF THE INVENTION

1. Field of the Invention

The present invention relates to a semiconductor device manufacturing method, wiring and a semiconductor device and, more particularly, to a semiconductor device manufacturing method, wiring and a semiconductor device using polycrystalline silicon (Si) or polycrystalline silicon germanium (SiGe) as a gate electrode material.

2. Background Art

In recent years, large-scale integrated circuits (LSIs) formed by coupling a multiplicity of components including transistors and resistors to each other in an electrical circuit and by integrating the components into one chip have been put to greater use in important portions of computers and communication apparatuses. Therefore the overall performance of such apparatuses depends largely on the performance of LSIs in a single state.

An improvement in performance of an LSI in a single state can be achieved, for example, by increasing the degree of integration, i.e., by making elements smaller. An element, e.g., a MOS field effect transistor (MOS FET) can be made smaller by reducing the gate length and reducing the thickness of source and drain regions.

As a method for forming shallow source and drain regions, a low-speed ion implantation method is being widely used. This method ensures that source and drain regions having a depth of 0.1 µm or smaller can be formed.

An impurity diffusion layer formed by the low-speed ion implantation method, however, has a high sheet resistance of 100 Ω/ or more. An increase in operating speed by the smaller elements cannot be expected if this problem is not solved.

In a device such as a logic LSI of which high-speed operation is required, a silicide film is formed on the surfaces of a source diffusion layer, a drain diffusion layer and a gate electrode ($n^+$ or $p^+$ polycrystalline silicon) in a self-alignment manner, that is, salicide (self-aligned silicide) is used in order to reduce the resistance of the source, drain and gate.

In a case where a dual gate structure using $n^+$ and $p^+$ polycrystalline silicon as a base for a silicide layer in the same layer is adopted, a salicide structure is effective in simplifying the process as well as in reducing the resistance of a gate electrode. This is because, when a source and a drain are doped with an impurity, doping of gate polycrystalline silicon can be simultaneously performed. In general, a salicide process is a technique to form silicide only on a source, a drain, a gate electrode and wiring Si in a self-alignment manner by forming a metal film on Si and an insulating film pattern and heating the metal film. In some case, a PMOS FET and an NMOS FET are formed side by side.

In a case where a PMOS FET and an NMOS FET are formed side by side, a region doped simultaneously with two kinds of impurities: n-type and p-type impurities exists in a semiconductor layer. If a salicide process is performed on this region, various problems relating to the silicide layer formed by the process arise, depending on a combination of used materials, a temperature condition. In such a case, the silicide layer cannot be uniformly formed and a low-resistance electrode and a low-resistance wiring structure cannot be obtained.

SUMMARY OF THE INVENTION

According to an aspect of an embodiment of the present invention, there is provided a method of manufacturing a semiconductor device including forming a silicide film on a surface of a semiconductor layer, the method also including forming in the semiconductor layer a p-type impurity layer, an n-type impurity layer and a (p+n)-type impurity layer between the n-type and p-type impurity layers by introducing impurities, forming an impurity segregation layer on the n-type and p-type impurity layers and the (p+n)-type impurity layer by heat-treating the semiconductor layer, removing the impurity segregation layer, and thereafter forming the silicide film by forming a film of a metallic material on the semiconductor layer and by heat-treating the film of the metallic material.

According to an aspect of another embodiment of the present invention, there is provided a method of manufacturing a semiconductor device including forming a silicide film on a surface of a semiconductor layer, the method also including forming in the semiconductor layer a p-type impurity layer, an n-type impurity layer and a (p+n)-type impurity layer between the n-type and p-type impurity layers by introducing impurities, forming an impurity segregation layer on the n-type and p-type impurity layers and the (p+n)-type impurity layer by heat-treating the semiconductor layer, removing an oxide film on the impurity segregation layer, introducing an impurity into the impurity segregation layer, and thereafter forming the silicide film by forming a film of a metallic material on the impurity segregation layer and by heat-treating the film of the metallic material.

According to an aspect of still another embodiment of the present invention, there is provided wiring formed by a silicide layer formed on a semiconductor layer which has at least one of a p-type impurity portion into which a p-type impurity is introduced and an n-type impurity portion into which an n-type impurity is introduced, and a (p+n)-type impurity portion into which the p-type and n-type impurities are introduced, wherein the total concentration of the p-type impurity and the n-type impurity contained in the (p+n)-type impurity portion is $5E20$ $cm^{-3}$ or less in the (p+n)-type impurity portion.

According to an aspect of a further embodiment of the present invention, there is provided a semiconductor device having a PMOS FET, an NMOS FET, and wiring provided as a gate electrode formed in common to the PMOS FET and the NMOS FET, the wiring being formed by a silicide layer formed on the a semiconductor layer, the semiconductor layer having a p-type impurity portion into which a p-type impurity is introduced, an n-type impurity portion into which an n-type impurity is introduced, and a (p+n)-type impurity portion into which the p-type and n-type impurities are introduced, wherein the total concentration of the p-type impurity and the n-type impurity contained in the (p+n)-type impurity portion is $5E20$ $cm^{-3}$ or less in the (p+n)-type impurity portion.

DESCRIPTION OF THE EMBODIMENTS

Figure 1A:
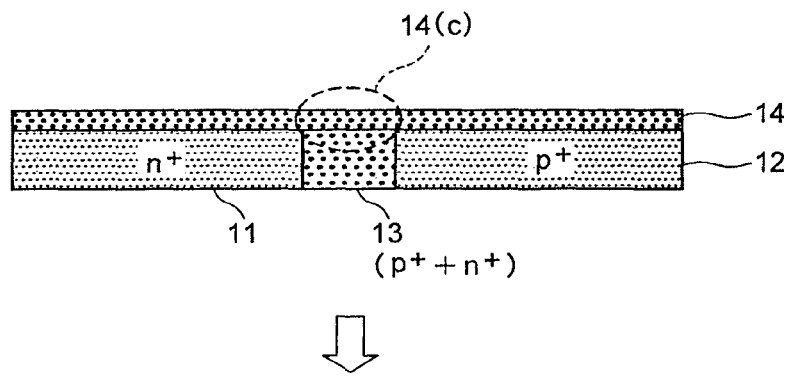
FIGS. 1(A) to 1(C) are schematic sectional views for explaining the structure of a semiconductor device and a method of manufacturing the semiconductor device in Embodiment 1 of the present invention.

Techniques which the inventor of the present invention knows will be described before the description of embodiments of the invention. When salicide is formed, that is, silicide is formed on a source, a drain and a gate, the interface between silicide and Si becomes a deep junction such that silicide grows in a state of sinking in Si. That is, if the depth (deep junction) of a diffusion layer in a region where silicide is formed is about 100 nm, $CoSi_2$ for example sinks by 36 nm and the remaining depth is 64 nm. If the difference between the sinking depth and the remaining depth is about the value in this example, the problem of a junction leak through the above-mentioned deep junction can be solved, for example, by increasing the depth of the diffusion layer to some extent or slightly reducing the silicide film thickness.

However, when the depth of the deep junction is 80 to 90 nm, the remaining depth with respect to the sinking depth of 36 mm of $CoSi_2$ is 44 to 54 nm and the junction leak increases abruptly. That is, $CoSi_2$ can no longer be used without using a high-cost elevated S/D method.

While the amount of sinking of $CoSi_2$ in a Si substrate is about 36 nm, the amount of sinking of NiSi is about 29 nm and the amount of sinking of $Pd_2Si$ is about 25 nm. It can be understood that the depth of sinking of NiSi or $Pd_2Si$ in a Si substrate is smaller by about 7 to 10 nm than that of $CoSi_2$.

That is, if NiSi or $Pd_2Si$ is used, the depth of sinking of silicide in a Si substrate can be reduced by about 10 nm to reduce the junction leak. Use of a high-cost elevated S/D method can be avoided in this case.

In a case where $CoSi_2$ is formed as a silicide, there is also a problem with the shape of $CoSi_2$ formed. That is, irregularities are formed in the $CoSi_2$ bottom surface. If a large crystal defect or stress exists in Si close to the irregularities, spiked silicide is formed. Simultaneously with the formation of silicide, diffusion (spread) of Co also occurs.

On the other hand, in a case where a metallic material is used, the formation of silicide spikes and diffusion of Co can be limited by making use of a low-temperature process or a high-speed temperature changing process.

In a case where NiSi or $Pd_2Si$ is formed, there is a need to perform a low-temperature process of 600° C. or lower for postprocessing. If the processing temperature is higher than 600° C., phase transition from NiSi to $NiSi_2$ and phase transition from $Pd_2Si$ to PdSi are caused and irregularities in the interface between silicide and Si are increased. Therefore there is a limit to the temperature at which a heat treatment is performed after the formation of silicide.

In a case where silicide is formed on ordinary $n^+Si$ or $p^+Si$, the problem can be solved if a thermal budget is made, as can be understood from the above description.

A salicide process is performed to reduce the resistance by forming NiSi on polycrystalline silicon or polycrystalline silicon germanium. In the salicide process, Ni film having a thickness of 7 to 15 nm is formed on polycrystalline silicon or polycrystalline silicon germanium. Heating at 300 to 400° C. is thereafter performed to form $Ni_2Si$ or NiSi. Subsequently, unreacted Ni film on the insulating film is removed by using a solution of a mixture of hydrogen peroxide and sulfuric acid (or hydrochloric acid) or a solution prepared by diluting a hydrogen peroxide solution with pure water. Heating at 400 to 500° C. is thereafter performed to complete the formation of silicide. If silicide is formed in this way, a resistance of 10 Ω/ or less can be obtained in an $n^+$ region doped with As or P and in a $p^+$ region doped with B.

The structure of a semiconductor device and a method of manufacturing the semiconductor device according to the techniques grasped by the inventor as described above will be described with reference to schematic sectional views of FIGS. 3(A) and 3(B). Before the description of the device and method, techniques which are a basis for the present invention will be described with reference to FIG. 4.

Figure 3A:
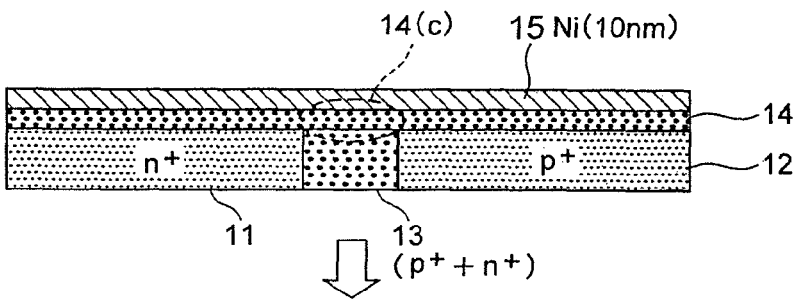
FIGS. 3(A) and 3(B) are schematic sectional views for explaining the structure of a semiconductor device and a method of manufacturing the semiconductor device known by the inventor of the present invention.
Figure 3B:
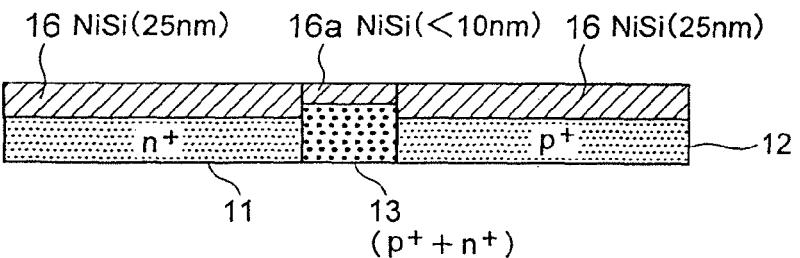
Figure 4A:
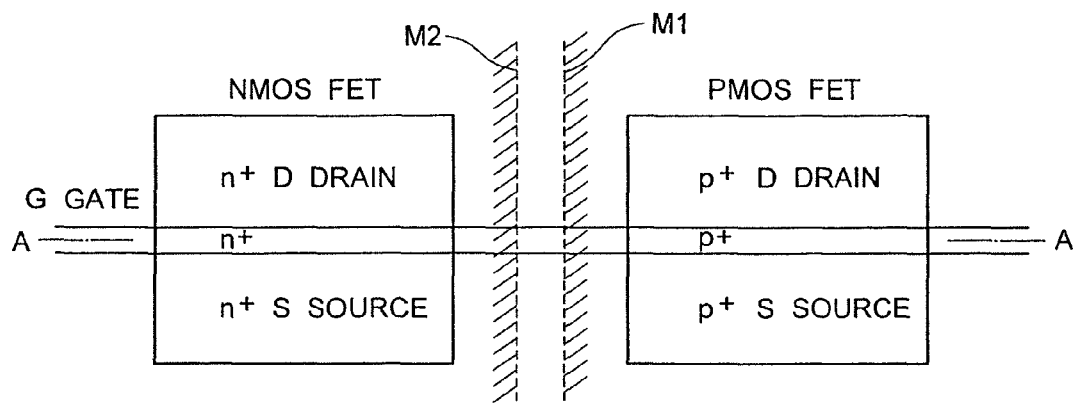
FIGS. 4(A) to 4(D) are a plan view of a PMOS FET and an NMOS FET and sectional views showing steps in a process of fabricating the PMOS FET and the NMOS FET.
Figure 4B:
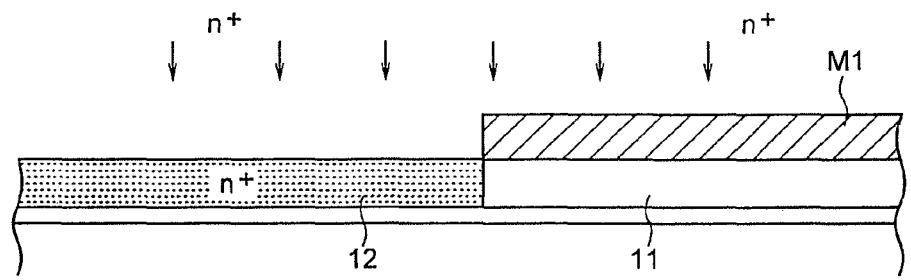
Figure 4C:
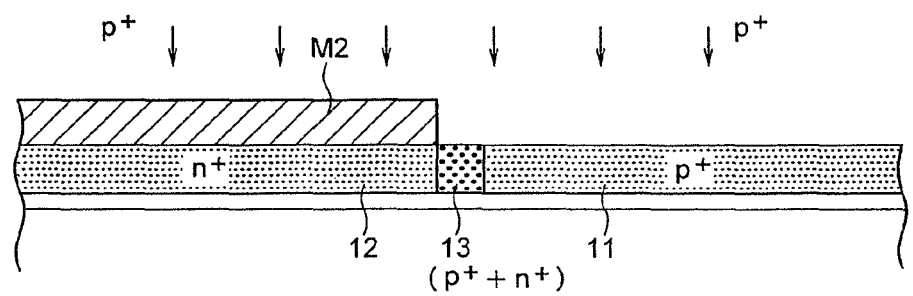
Figure 4D:
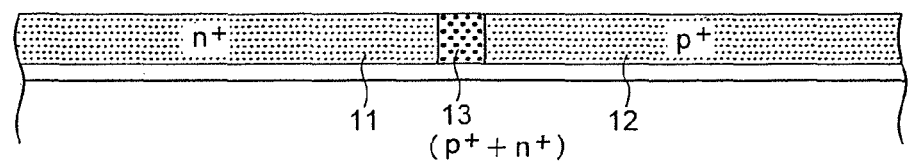

FIGS. 4(A) to 4(D) are a plan view of a device in which a PMOS FET and an NMOS FET are formed side by side and sectional views taken along line A-A in the plan view. As shown in FIG. 4(A), the PMOS FET and NMOS NET are formed. As is well known, when a MOS FET is formed, a gate in band form is formed on a semiconductor substrate, with a gate insulating film interposed therebetween, and an impurity is implanted into the semiconductor substrate, with the gate used as a mask. Source and drain regions are thereby formed. At this time, the impurity is introduced into the gates as well. Forming the PMOS FET and NMOS FET side by side requires alternately implanting a p-type impurity and an n-type impurity. When one of the impurities is implanted, the top of the region into which the other impurity is to be introduced is covered with a mask to prevent the one of the impurity from being introduced into this region. FIGS. 4(B) and 4(C) show an example of this alternate implantation in sectional views taken along line A-A of FIG. 4(A). First, in the case of implantation of the $n^+$ impurity, a mask M1 is first formed, as shown on the right-hand side of FIG. 4(B), followed by implantation. The $n^+$ impurity is thereby implanted into a first exposed portion on a gate insulating film 101 on a semiconductor substrate 100 shown on the left-hand side of FIG. 4(B), which portion is not covered with the mask M1. A polycrystalline silicon region 12 is thereby formed. Thereafter, for implantation of the $p^+$ impurity, a mask M2 is formed, as shown on the left-hand side of FIG. 4(C), followed by implantation. A polycrystalline silicon region 11 into which the $p^+$ impurity is implanted is thereby formed in a second exposed portion shown on the right-hand side of FIG. 4(C). The masks M1 and M2 are provided by factoring in a misalignment margin. Therefore, both the impurities are implanted into a doubly exposed portion, shown as a central portion in FIG. 4(C). A boundary region 13 is thereby formed. FIG. 4(D) shows a state after removal of the mask M2 from the state shown in FIG. 4(C). FIGS. 3(A) and 3(B) show a portion of FIG. 4(D). That is, FIGS. 3(A) and 3(B) show only extracted portions: a polycrystalline silicon gate electrode and a wiring portion, for ease of explanation, omitting processes of forming a device separation region, a source, a drain, a well, a channel, and a gate side wall spacer, necessary for manufacture of an actual transistor.

As shown in FIG. 3(A), an impurity segregation layer 14 where the impurities segregate at a high concentration is formed by performing rapid thermal annealing (RTA) as an activating heat treatment at 1000° C. or more for 10 seconds or less on surface layers in the n+ polycrystalline silicon region 11 and the p+ polycrystalline silicon region 12. The boundary region 13 adjacent to the n+ polycrystalline silicon region 11 and adjacent to the p+ polycrystalline silicon region 12 is doped with each of the n+ impurity and p+ impurity at a high concentration of 1E20 cm$^{-3}$ or more. In particular, a surface layer portion of the boundary region 13 in the impurity segregation layer 14 is doped with B and P or B and As+P at a high concentration.

A metallic material film 15 of Ni is thereafter formed to a thickness of 7 to 15 nm and is heated at 300 to 400° C. for 30 seconds. In this case, an NiSi metal silicide film 16 with a sufficiently large thickness is formed on the polycrystalline silicon regions 11 and 12 on the opposite sides, as shown in FIG. 3(B). On the other hand, in a surface layer portion of the boundary region 13 formed as a doubly doped region, a metallic silicide film 16a is formed in which NiSi metal silicide film is not sufficiently formed. There is a problem that the sheet resistance of a gate electrode or wiring is increased due to the formation of metallic silicide film 16a.

If the NiSi formation temperature is increased to about 600° C., the NiSi film thickness in the n+-p+overlap portion can be increased to about 1.5 times. In the case of increasing the formation temperature, however, there is a problem that NiSi agglomerates to form an island-like shape or changes into Si-rich silicide, which is NiSi2, to bite deeply into Si, or Ni film on peripheral STI convergently enters an Si portion at an isolated pattern portion to increase the NiSi thickness to a value exceeding the design thickness.

The inventor of the present invention also knows that this problem cannot be solved by forming Ni film after removing the oxide film on the polycrystalline silicon or polycrystalline silicon germanium surface.

As a solution to these problems, a method is known in which the regions doped with n+ and p+ impurities are shifted by a mask design so as not to overlap. In production of small batches of a variety of products such as SOC products, however, circuit patterns vary among the products, and there is a problem that, if this method is used, the amount of CAD correction work is increased and, in some case, a design change is extremely difficult to accomplish.

The inventor of the present invention has found, through experiments made by the inventor, that a phenomenon which leads to the above-described drawbacks occurs in the presence of both an n-type impurity and a p-type impurity, such as B and P, B and As, or B and (As+P), at a high concentration.

Figure 5:
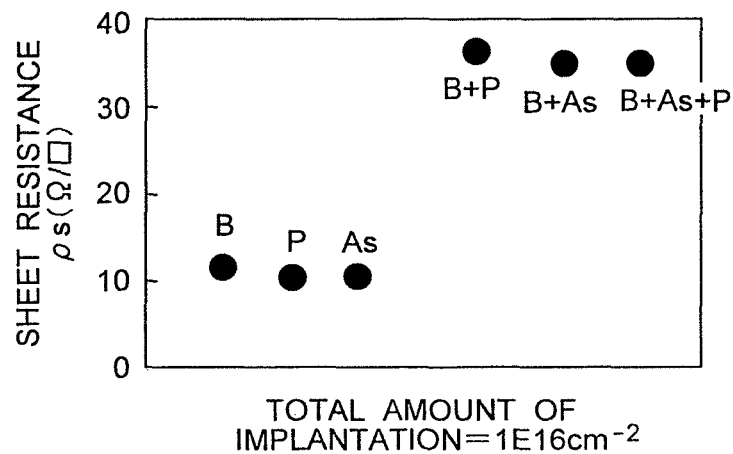
FIG. 5 is a graph showing the results of experiments made by the inventor to confirm drawbacks in a semiconductor process.
Figure 6:
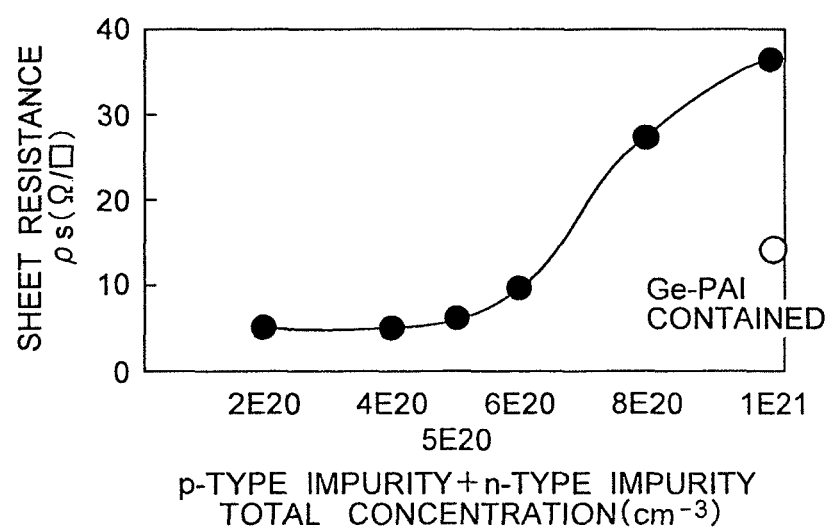
FIG. 6 is a graph showing the results of experiments made by the inventor to confirm a phenomenon in the semiconductor process.

FIGS. 5 and 6 show this finding.

FIG. 5 shows the results of six experiments made. The total amount of implantation into polycrystalline silicon was set to 1E16 cm$^{-2}$.

As is apparent from FIG. 5, the sheet resistance in the case of polycrystalline silicon into which B, P, or As is singly implanted at 1E16 cm$^{-2}$ is about 10 Ω/.

The inventor has found that, in contrast with these results, the sheet resistance in the case of implantation of B at 5E15 cm$^{-2}$ and P at 5E15 cm$^{-2}$, a total of 1E16 cm$^{-2}$, the sheet resistance in the case of implantation of B at 5E15 cm$^{-2}$ and As at 5E15 cm$^{-2}$, a total of 1E16 cm$^{-2}$ and the sheet resistance in the case of implantation of B at 5E15 cm$^{-2}$, P at 3E15 cm$^{-2}$ and As at 2E15 cm$^{-2}$, a total of 1E16 cm$^{-2}$ are each 30 to 40 Ω/.

From experiments in which the total amount of implantation was changed, it has been found that, when the total impurity concentration in a Si surface layer exceeds 5E20 cm$^3$, the thickness of Ni silicide is reduced and the sheet resistance is increased, as shown in the graph of FIG. 6.

It has also been found that each impurity segregates in the polycrystalline silicon surface at a concentration higher than a concentration at which it segregates in an inner portion.

Further, it has also been found that the silicide forming metal can be enabled to easily react with Si if a surface layer region of a depth of 5 nm or less where the impurities are precipitated after impurity doping is removed or the B—P or B—As bond is cut by ion implantation or plasma doping with an element which does not affect silicidation.

The present invention has been made on the basis the above-described unique findings obtained only by the inventor of the present invention.

The formation of a MOS transistor structure on a semiconductor substrate in embodiments of the present invention will be described by way of example with respect to the best mode of implementation of the present invention with reference to the accompanying drawings. The embodiments will be described below with respect to use of polycrystalline silicon. However, the same results can also be obtained in embodiments using polycrystalline silicon germanium.

FIG. 1(A) and FIG. 3(A) show an n+ polycrystalline silicon region 11, a p+ polycrystalline silicon region 12 and a boundary region (p+ impurity+n+ impurity) 13. These portions are made by process steps including those described above with reference to FIG. 4. That is, an n-type impurity and a p-type impurity are alternately implanted to form a PMOS FET and an NMOS FET side by side. First, for implantation of the n+ impurity, a mask M1 is first formed, as shown on the right-hand side of FIG. 4(B). For implantation of the p+ impurity, a mask M2 is formed, as shown on the left-hand side of FIG. 4(C). In each state after the formation of the mask, the corresponding impurity is implanted. The polycrystalline silicon region 12 into which the n+ impurity is implanted is formed in the first exposed portion not covered with the mask M1 on the left-hand side of FIG. 4(B). The polycrystalline silicon region 11 into which the p+ impurity is implanted is formed in the second exposed portion shown on the right-hand side of FIG. 4(C). Both the impurities are implanted into a doubly exposed portion, shown as a central portion in FIG. 4(C), thereby forming the boundary region 13. The order in which the p+ and n+ impurities are implanted may be reversed from the shown above, that is, the p+ impurity is first implanted. The present invention is also applicable in such a case.

(Embodiment 1)

Figure 1B:
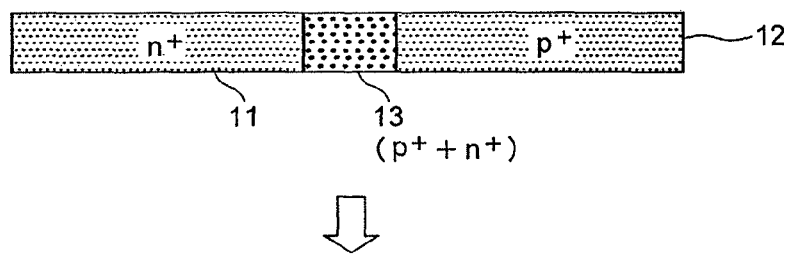
Figure 1C:
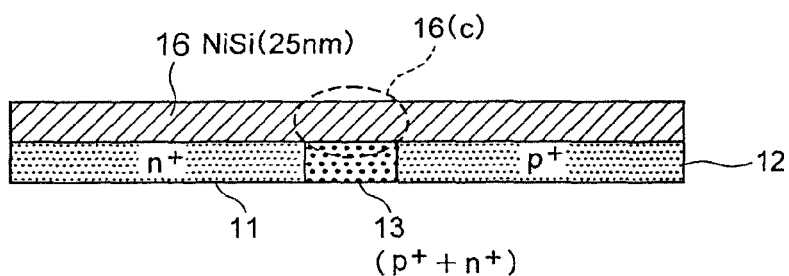

FIGS. 1(A), 1(B), and 1(C) are schematic sectional views for explaining the structure of a semiconductor device and a method of manufacturing the semiconductor device in Embodiment 1 of the present invention.

FIGS. 1(A), 1(B), and 1(C) show only extracted portions: a polycrystalline silicon gate electrode and a wiring portion, for ease of explanation, omitting processes of forming a device separation region, a source, a drain, a well, a channel, and a gate side wall spacer, necessary for manufacture of an actual transistor. Also, gate oxide film is not shown in the figures.

As shown in FIG. 1(A), an impurity segregation layer 14 where the impurities segregate at a high concentration is formed to a thickness of about 5 nm by performing RTA as an activating heat treatment at 1000° C. or more for 10 seconds or less on surface layers in the n+ polycrystalline silicon region 11 and the p+ polycrystalline silicon region 12.

The boundary region 13 adjacent to the n+ polycrystalline silicon region 11 and adjacent to the p+ polycrystalline silicon region 12 is doped with each of the n+ impurity and p+ impurity at a high concentration of 1E20 cm$^{-3}$ or more. In particular, an impurity segregation layer 14(C) (1-5 nm) corresponding to a surface layer of the region 13 is doped with B and P or B and (As+P) at a high concentration. Ga or In other than B in the group III elements may alternatively be used. Also, Sb other than P and As in the group V elements may alternatively be used. The same can be said with respect to Embodiment 2 described below.

Subsequently, the impurity segregation layer 14 formed as a polycrystalline silicon surface layer is removed by dry etching or wet etching, as shown in FIG. 1(B).

In a case where dry etching is performed, NF$_3$+H$_2$ mixture gas, SF$_6$+H$_2$ mixture gas, F$_2$+H$_2$ mixture gas, HF gas, or the like is supplied to the Si substrate under a pressure of 0.5 atm. or lower to remove the impurity segregation layer 14 formed as a polycrystalline silicon surface layer. A method of supplying the gas while heating the Si substrate at about 100 to 300° C. or performing heating after supply of the gas may be used, depending on the kind of the gas used.

In a case where wet etching is performed, the surface layer is removed by using an alkaline solution such as choline, or by changing the surface layer into an oxide film by a mixture solution such as a sulfuric acid/hydrogen peroxide solution, a hydrochloric acid/hydrogen peroxide solution or an aqueous ammonium/hydrogen peroxide solution and removing the oxide film by a diluted hydrofluoric acid or ammonium fluoride solution. After wet etching, there is a need to perform drying of the wafer using isopropyl alcohol or the like with care so that no water glass (watermark) remains on the surface layer.

As described above, a Si surface layer with a thickness of 5 nm or less is removed by etching to limit the total impurity concentration in the Si surface layer to 5E20 cm$^{-3}$ or less, preferably 4E20 cm$^{-3}$ or less.

The above-described processing is performed to limit the reduction in thickness of the Ni silicide film and to limit the increase in sheet resistance.

Thereafter, a metallic material film of Ni is formed to a thickness of 7 to 15 nm and is heated at 250 to 500° C., preferably 250 to 350° C. for 30 seconds. An NiSi metal silicide film 16 is thereby formed, as shown in FIG. 1(C). At this time, NiSi metal silicide film 16(c) is also formed sufficiently in a surface layer portion of the boundary region 13 formed as a doubly doped region, thus making it possible to obtain the desired sheet resistance of a gate electrode or wiring.

(Embodiment 2)

Figure 2A:
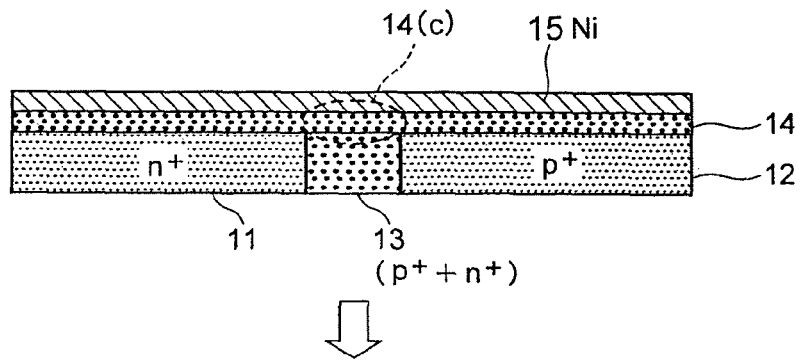
FIGS. 2(A) and 2(B) are schematic sectional views for explaining the structure of a semiconductor device and a method of manufacturing the semiconductor device in Embodiment 2 of the present invention.
Figure 2B:
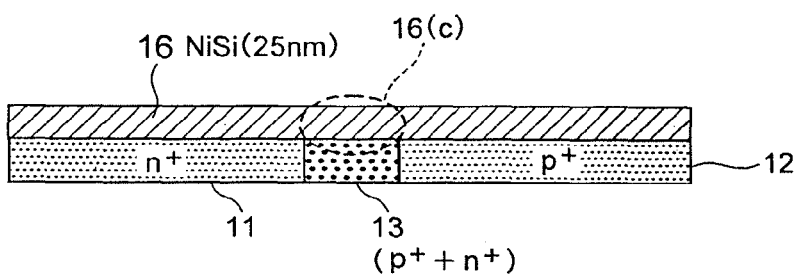

FIGS. 2(A) and 2(B) are schematic sectional views for explaining the structure of a semiconductor device and a method of manufacturing the semiconductor device in Embodiment 2 of the present invention.

FIGS. 2(A) and 2(B) show only extracted portions: a polycrystalline silicon gate electrode and a wiring portion, for ease of explanation, omitting processes of forming a device separation region, a source, a drain, a well, a channel, and a gate side wall spacer, necessary for manufacture of an actual transistor, as do FIGS. 1(A) to 1(C). Also, gate oxide film is not shown in the figures.

As shown in FIG. 2(A), an impurity segregation layer 14 where the impurities segregate at a high concentration is formed by performing RTA as an activating heat treatment at 1000° C. or more for 0 to 10 seconds on surface layers in the n+ polycrystalline silicon region 11 and the p+ polycrystalline silicon region 12.

The boundary region 13 adjacent to the n+ polycrystalline silicon region 11 and adjacent to the p+ polycrystalline silicon region 12 is doped with each of the n+ impurity and p+ impurity at a high concentration of 1E20 cm$^{-3}$ or more. In particular, an impurity segregation layer 14(C) corresponding to a surface layer of the region 13 is doped with B and P or B and (As+P) at a high concentration.

Ge is implanted into this polycrystalline silicon surface layer (impurity segregation layer 14) at 5E14 cm$^{-2}$ to 5E15 cm$^{-2}$ by 10 to 20 keV. Thereafter, a metallic material film 15 of Ni is formed to a thickness of 7 to 15 nm and is heated at 250 to 500° C., preferably 250 to 350° C. for 30 seconds. An NiSi metal silicide film 16 is thereby formed, as shown in FIG. 2(B). NiSi metal silicide film 16(c) is also formed sufficiently in a surface layer portion of the boundary region 13 formed as a doubly doped region, thus making it possible to obtain the desired sheet resistance of a gate electrode or wiring.

Kinds of ion other than Ge effective in breaking the polycrystalline silicon surface layer are Si and Sn.

The embodiments have been described by way of example with respect to a MOS transistor used as a semiconductor device. Needless to say, the present invention can be applied in the same manner to any other semiconductor element incorporated in a semiconductor device.

According to the embodiments of the present invention, as described above, silicide can be uniformly formed on a region in a semiconductor layer into which two kinds of impurities, n-type and p-type impurities are introduced, as is that on a region into which one of the two impurities is introduced, thus realizing a low-resistance electrode and a low-resistance wiring structure.

What is claimed is:

1. A method of manufacturing a semiconductor device including forming a silicide layer on a surface of a semiconductor layer, the method comprising:
    forming in the semiconductor layer a p-type impurity region, an n-type impurity region and a (p+n)-type impurity region between the n-type and p-type impurity regions by implanting impurities;
    after formation of the p-type impurity region, the n-type impurity region and the (p+n)-type impurity region, heat treating the semiconductor layer at the temperature of 1000° C. or more;
    after the heat treatment, removing a part of a surface region of the semiconductor layer;
    after removing the part of the surface region, forming a metallic material film on the semiconductor layer; and
    after formation of the metallic material film, forming a silicide layer by heat treating the metallic material film.

2. A method of manufacturing a semiconductor device including forming a silicide layer on a surface of a semiconductor layer, the method comprising:
    forming in the semiconductor layer a p-type impurity region, an n-type impurity region and a (p+n)-type impurity region between the n-type and p-type impurity regions by implanting impurities;
    after formation of the p-type impurity region, the n-type impurity region and the (p+n)-type impurity region, heat treating the semiconductor layer at the temperature of 1000° C. or more;
    after the heat treatment, implanting or plasma doping with at least an element among Ge, Si and Sn to the semiconductor layer;
    after the implantation or the plasma doping, forming a metallic material film on the semiconductor layer; and
    after formation of the metallic material film, forming a silicide layer by heat treating the metallic material film.

3. The method according to claim 1, wherein the part of the surface region of the semiconductor layer is removed by using a dry etching or a wet etching.

4. The method according to claim 1, wherein, after removing the part of the surface region of the semiconductor layer, an impurity concentration of the (p+n)-type impurity region is 5E20 cm−3 or less.

5. The method according to claim 1, wherein the heat treatment is conducted to the (p+n)-type impurity region, in which a total impurity concentration of p-type and n-type impurities is 5E20 cm−3 or more.

6. The method according to claim 2, wherein the heat treatment is conducted to the (p+n)-type impurity region, in which a total impurity concentration of p-type and n-type impurities is 5E20 cm−3 or more.

7. The method according to claim 1, wherein an impurity concentration of the surface region of the semiconductor layer is increased higher than an impurity concentration of an internal part of the semiconductor layer below the surface region by the heat treatment.

8. The method according to claim 2, wherein an impurity concentration of the surface region of the semiconductor layer is increased higher than an impurity concentration of an internal part of the semiconductor layer below the surface region by the heat treatment.

9. The method according to claim 1, wherein a time period of the heat treatment is 10 second or less.

10. The method according to claim 2, wherein a time period of the heat treatment is 10 second or less.

11. The method according to claim 1, wherein one of As—B bond, P—B bond and As—B—P bond is included in the surface region of the semiconductor layer.

12. The method according to claim 2, wherein one of As—B bond, P—B bond and As—B—P bond is included in the surface region of the semiconductor layer.

13. The method according to claim 1, wherein Ni or an alloy of Ni and at least one of Pd, Pt and Co is used as the metallic material.

14. The method according to claim 2, wherein Ni or an alloy of Ni and at least one of Pd, Pt and Co is used as the metallic material.

15. The method according to claim 3, wherein, in the dry etching, gas including fluorine, gas including hydrogen or gas including fluorine and hydrogen is supplied to the semiconductor layer.

16. The method according to claim 3, wherein, in the dry etching, the semiconductor layer is heated at about 100° to 300° C in order to remove a part of the surface region of the semiconductor layer.

17. The method according to claim 3, wherein, the wet etching includes:
changing the surface layer into an oxide film by a first solution, and
removing the oxide film by a second solution.

18. The method according to claim 17, wherein,
the first solution is a mixture solution among a sulfuric acid/hydrogen peroxide solution, a hydrochloric acid/hydrogen peroxide solution or an aqueous ammonium/hydrogen peroxide solution, and
the second solution is a diluted hydrofluoric acid or ammonium fluoride solution.

* * * * *